(12) United States Patent
Picciotto et al.

(10) Patent No.: US 10,094,939 B2
(45) Date of Patent: Oct. 9, 2018

(54) SEMICONDUCTOR DETECTOR, RADIATION DETECTOR AND RADIATION DETECTION APPARATUS

(71) Applicants: FONDAZIONE BRUNO KESSLER, Trento (IT); HORIBA, Ltd., Kyoto-shi, Kyoto (JP)

(72) Inventors: Antonino Picciotto, Trento (IT); Pierluigi Bellutti, Trento (IT); Maurizio Boscardin, Trento (IT); Nicola Zorzi, Trento (IT); Daisuke Matsunaga, Kyoto (JP)

(73) Assignees: FONDAZIONE BRUNO KESSLER, Trento (IT); HORIBA, LTD., Kyoto (JP)

( * ) Notice: Subject to any disclaimer, the term of this patent is extended or adjusted under 35 U.S.C. 154(b) by 0 days.

(21) Appl. No.: 15/388,254

(22) Filed: Dec. 22, 2016

(65) Prior Publication Data

US 2017/0184734 A1    Jun. 29, 2017

(30) Foreign Application Priority Data

Dec. 24, 2015   (IT) .................. 102015000087736

(51) Int. Cl.
*G01T 1/24*    (2006.01)
*G01T 1/36*    (2006.01)
(Continued)

(52) U.S. Cl.
CPC .............. *G01T 1/366* (2013.01); *G01T 1/24* (2013.01); *G01T 1/247* (2013.01); *H01L 31/115* (2013.01); *H01L 31/118* (2013.01)

(58) Field of Classification Search
CPC .. G01T 1/00; G01T 1/36; G01T 1/366; G01T 1/247; H01L 27/14643; H01L 31/107; H01L 31/118
(Continued)

(56) References Cited

U.S. PATENT DOCUMENTS

| 4,608,095 A | * | 8/1986 | Hill | ............... | H01L 21/314 |
| | | | | | 148/33 |
| 5,465,002 A | * | 11/1995 | Snoeys | ............. | H01L 27/146 |
| | | | | | 250/370.08 |

(Continued)

FOREIGN PATENT DOCUMENTS

DE   10 2012 101 151 A1   11/2012
JP       2014-092448 A     5/2014

OTHER PUBLICATIONS

G. F. Dalla Betta et al., "Si—PIN X-ray detector technology", Nuclear Instruments & Methods in Physics Research Section A vol. 395, No. 3, Aug. 21, 1997, pp. 344-348 (5 pages).

(Continued)

*Primary Examiner* — Taeho Jo
(74) *Attorney, Agent, or Firm* — Robert P. Michal, Esq.; Carter, DeLuca, Farrell & Schmidt, LLP

(57) ABSTRACT

A semiconductor detector for detecting radiation comprises a first semiconductor part in which an electron and a hole are generated by incident radiation; a signal output electrode outputting a signal base on the electron or the hole; and a gettering part gettering impurities in the first semiconductor part. In addition, the semiconductor detector further comprises a second semiconductor part doped with a type of dopant impurities and having dopant impurity concentration higher than that of the first semiconductor part. The second semiconductor part is in contact with the first semiconductor part. The gettering part is in contact with the second semi- (Continued)

conductor part and not in contact with the first semiconductor part.

6 Claims, 7 Drawing Sheets

(51) Int. Cl.
  *H01L 31/118* (2006.01)
  *H01L 31/115* (2006.01)
(58) Field of Classification Search
  USPC .................................................. 250/370.01
  See application file for complete search history.

(56) References Cited

U.S. PATENT DOCUMENTS

| | | | | |
|---|---|---|---|---|
| 5,583,352 | A * | 12/1996 | McIntyre | H01L 31/107 257/186 |
| 6,249,033 | B1 * | 6/2001 | Castoldi | H01L 27/14658 257/186 |
| 8,481,953 | B2 * | 7/2013 | Christophersen | G03F 7/70283 250/370.01 |
| 2004/0113185 | A1 * | 6/2004 | Shibayama | H01L 27/1446 257/292 |
| 2005/0173733 | A1 * | 8/2005 | Struder | H01L 27/14603 257/202 |
| 2006/0175677 | A1 * | 8/2006 | Carlson | H01L 27/1446 257/447 |
| 2007/0072332 | A1 * | 3/2007 | Kemmer | H01L 27/14603 438/56 |
| 2007/0187724 | A1 * | 8/2007 | Kaufmann | H01L 27/14603 257/239 |
| 2008/0212739 | A1 * | 9/2008 | Fukai | G01N 23/223 378/86 |
| 2009/0026569 | A1 * | 1/2009 | Dongliang | H01L 31/03528 257/465 |
| 2010/0314706 | A1 * | 12/2010 | Hullinger | G01T 1/2928 257/466 |
| 2011/0012216 | A1 * | 1/2011 | Morichi | G01T 1/2928 257/429 |
| 2012/0161266 | A1 * | 6/2012 | Christophersen | G03F 7/70283 257/429 |
| 2012/0313195 | A1 * | 12/2012 | Decker | H01L 27/14658 257/428 |
| 2013/0099114 | A1 * | 4/2013 | Kooijman | G01T 1/24 250/307 |
| 2013/0299698 | A1 * | 11/2013 | Schamber | H01J 37/244 250/310 |
| 2014/0042316 | A1 * | 2/2014 | Barbi | G01T 1/2018 250/307 |
| 2014/0077271 | A1 * | 3/2014 | Fujii | H01L 27/1461 257/239 |
| 2014/0124865 | A1 | 5/2014 | Yasui et al. | |
| 2014/0306120 | A1 * | 10/2014 | Li | G01T 1/2928 250/394 |
| 2015/0235866 | A1 * | 8/2015 | Nakamura | H01L 21/3221 257/77 |

OTHER PUBLICATIONS

J.D. Segal et al., "A new structure for controlling dark current due to surface generation in drift detectors", Nuclear Instruments & Methods in Physics Research Section A vol. 414, No. 2-3, Sep. 11, 1998, pp. 307-316 (10 pages).

C. S. Tindall et al., "Silicon Detectors for Low Energy Particle Detection", 2006 IEEE Nuclear Science Symposium Conference Record; Oct. 29-Nov. 4, 2006; San Diego, CA, USA, IEEE Service Center, Piscataway, NJ, USA, Oct. 1, 2006, pp. 1434-1439 (6 pages).

Wei Chen et al., "Recent Developments in the Processing of P-type Spiral Drift Detectors", 2004 IEEE Nuclear Science Symposium Conference Record Oct. 16-22, 2004 Rome, Italy, IEEE, Piscataway, NJ, USA, vol. 2, Oct. 16, 2004, pp. 1024-1028 (5 pages).

Italian Search Report issued by the Italian Patent Office in relation to Italian Patent Application No. 102015000087736 with English translation dated Sep. 14, 2016 (11 pages).

* cited by examiner

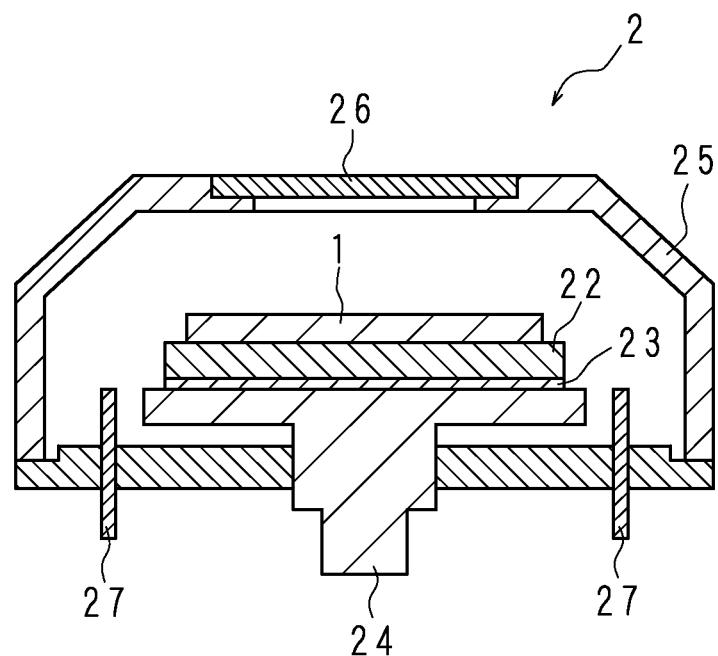
F I G. 4

SEMICONDUCTOR DETECTOR, RADIATION DETECTOR AND RADIATION DETECTION APPARATUS

CROSS-REFERENCE TO RELATED APPLICATION

This non-provisional application claims priority under 35 U.S.C. § 119(a) to Italian Patent Application No. 102015000087736 filed on Dec. 24, 2015, the entire contents of which are hereby incorporated by reference.

FIELD

The present invention relates to a semiconductor detector, a radiation detector and a radiation detection apparatus for detecting radiation.

BACKGROUND

An example of a method for detecting radiation such as X-ray includes a method using a semiconductor detector. A silicon drift detector (SDD) is one of semiconductor detectors which has a large area and can perform detection with low noise. An SDD has a problem in that leakage current occurs inside thereof. Since such leakage current may be a cause of noise, it is desired to reduce leakage current as much as possible. Conventionally, cooling has been performed on an SDD in order to reduce leakage current. Japanese Patent Application Laid-Open Publication No. 2014-92448 discloses a radiation detector including an SDD and a cooling part for cooling the SDD. The radiation detector having an SDD is included in a radiation detection apparatus which detects radiation generated from a sample by the radiation detector and analyzes the sample.

SUMMARY

A cooling part is required for using an SDD, while the SDD needs to be covered with a housing in order to be placed in vacuum or dry gas. As such, there is a limit in downsizing of a radiation detector using an SDD.

A radiation detection apparatus including a radiation detector has a lowered degree of freedom in design such as, for example, difficulty in placement of the radiation detector at an appropriate position due to a large size of the radiation detector. This makes it difficult to appropriately design the radiation detection apparatus to improve the accuracy of detecting radiation.

An aspect of the present disclosure has been made in view of the circumstances described above and aims to provide a semiconductor detector, a radiation detector and a radiation detection apparatus that allow for downsizing of a radiation detector and improvement in accuracy of detecting radiation by loosening the conditions for cooling in order to reduce leakage current, for example, by simplifying or eliminating a cooling part.

A semiconductor detector according to an aspect of the present disclosure comprises a first semiconductor part in which an electron and a hole are generated by incident radiation; a signal output electrode outputting a signal base on the electron or the hole; a gettering part gettering impurities in the first semiconductor part; and a second semiconductor part doped with a type of dopant impurities and having dopant impurity concentration higher than impurity concentration of the first semiconductor part. The second semiconductor part is in contact with the first semiconductor part, and the gettering part is in contact with the second semiconductor part and not in contact with the first semiconductor part.

The impurities in the first semiconductor part pass through the second semiconductor part, are trapped in the gettering part and decreased. As the impurities in the first semiconductor part decreases, leakage current in the semiconductor detector is reduced. Moreover, since the gettering part is in contact with the second semiconductor part while not being in contact with the first semiconductor part, dopant impurities included in the gettering part will not flow out to the first semiconductor part. Thus, the gettering part has no adverse effect on the performance of detecting radiation. As such, the gettering part produces no adverse effect on the operation of the semiconductor detector, which makes it possible to leave the gettering part until the end of the manufacturing procedure for the semiconductor detector and to use the semiconductor detector while being provided with the gettering part. Accordingly, it is unnecessary to remove the gettering part in the manufacturing procedure for the semiconductor detector, and therefore impurities that are unintentionally mixed in during the manufacturing procedure may reliably be trapped until the end of the manufacturing procedure.

In the semiconductor detector according to an aspect of the present disclosure, the first semiconductor part has a plate-like shape, the second semiconductor part is located at one surface of the first semiconductor part, the other surface of the first semiconductor part is an entrance surface for incident radiation, and the gettering part is located on the second semiconductor part.

By making radiation enter from the other surface of the semiconductor part, radiation can be detected in such a manner that the gettering part does not affect the entrance of radiation.

In the semiconductor detector according to an aspect of the present disclosure, the second semiconductor part is formed with multiple curved elements.

As the gettering part is formed on each of the multiple curved elements which are included in the second semiconductor part and located at one surface of the first semiconductor part, the gettering part is provided in a wide area of the semiconductor detector. The distance between the impurities in the first semiconductor part to the gettering part is thus made shorter, and therefore the impurities are easily trapped.

In the semiconductor detector according to an aspect of the present disclosure, a main constituent of each of the first semiconductor part and the second semiconductor part is silicon, and the gettering part includes polysilicon.

The gettering part is made of polysilicon in direct contact with the second semiconductor part, and the impurities included in the first semiconductor part made of silicon are trapped in the gettering part.

A radiation detector according to an aspect of the present disclosure comprises the semiconductor detector according to the aspect of the present disclosure, a circuit board on which the semiconductor detector is mounted, and a base plate holding the semiconductor detector and the circuit board.

Leakage current of the semiconductor detector is reduced by a method other than cooling, so that a cooling part for cooling the semiconductor detector may be eliminated or downsized.

A radiation detection apparatus according to an aspect of the present disclosure comprises the semiconductor detector according to the aspect of the present disclosure, an output part outputting a signal corresponding to energy of radiation detected by the semiconductor detector, and a spectrum generation part generating a spectrum of the radiation based on the signal output by the output part.

The radiation detector using the semiconductor detector may be downsized. This improves the degree of freedom in design of the radiation detection apparatus provided with the radiation detector.

A radiation detection apparatus according to an aspect of the present disclosure detecting radiation generated from a sample irradiated with radiation comprises an irradiation part irradiating a sample with radiation, the semiconductor detector according to the aspect of the present disclosure detecting radiation generated from the sample, an output part outputting a signal corresponding to energy of radiation detected by the semiconductor detector, a spectrum generation part generating a spectrum of the radiation based on the signal output by the output part, and a display part displaying the spectrum generated by the spectrum generation part.

The radiation detector using the semiconductor detector may be downsized. This improves the degree of freedom in design of the radiation detection apparatus provided with the radiation detector.

According to an aspect of the present disclosure, leakage current may be reduced by a method other than cooling. The radiation detector may be configured while eliminating or downsizing a cooling part for cooling the semiconductor detector, and is thereby downsized. The aspect of the present disclosure produces a beneficial effect such as, for example, improvement in the degree of freedom in design of the radiation detection apparatus provided with the radiation detector, or higher accuracy of detecting radiation being possible owing to an appropriate design.

The above and further objects and features will more fully be apparent from the following detailed description with accompanying drawings.

BRIEF DESCRIPTION OF THE DRAWINGS

FIG. 4 is a schematic section view of a radiation detector according to Embodiment 1;

DETAILED DESCRIPTION

Embodiments of the present disclosure will be described below in detail with reference to the drawings illustrating the embodiments thereof.

Embodiment 1

Figure 1:
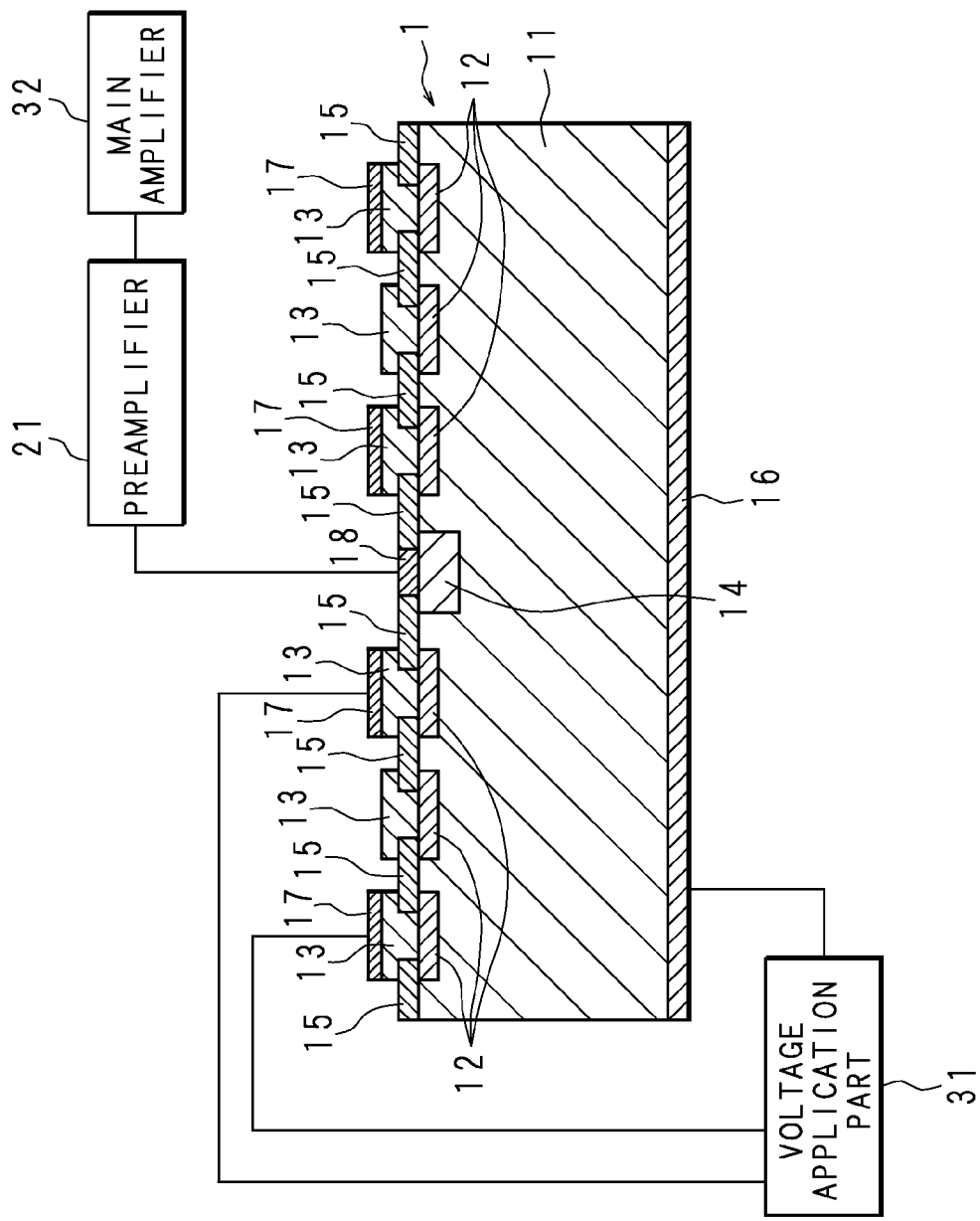
FIG. 1 is a block diagram illustrating a schematic section view of the structure of a semiconductor detector and a manner of electrical connection for the semiconductor detector.
Figure 2:
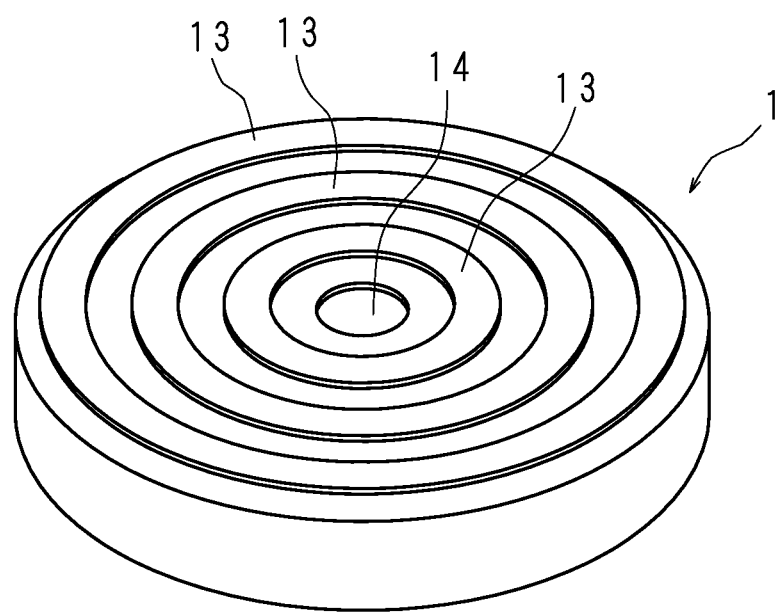
FIG. 2 is a schematic perspective view of a semiconductor detector.

FIG. 1 is a block diagram illustrating a schematic section view of the structure of a semiconductor detector and a manner of electrical connection for the semiconductor detector. FIG. 2 is a schematic perspective view of a semiconductor detector. A semiconductor detector 1 is a silicon drift detector (SDD). The semiconductor detector 1 includes a circular-disc-shaped or square-disc-shaped Si layer 11 made of silicon (Si). The Si layer 11 is made of, for example, an n-type Si. The Si layer 11 corresponds to a first semiconductor part. At the middle of one surface of the Si layer 11, a signal output electrode 14 is formed which serves as an electrode for outputting a signal at the time of detecting radiation. The constituent of the signal output electrode 14 is Si of the same type as that of the Si layer 11, which is doped with a specific type of dopant impurities such as phosphorus. The signal output electrode 14 is doped with the specific type of dopant impurities at higher concentration than that of the Si layer 11. Moreover, one surface of the Si layer 11 is provided with multiple ring-shaped electrodes 12. The ring-shaped electrode 12 is constituted by Si of a type different from that of the Si layer 11. The constituent of the ring-shaped electrode 12 is p+Si in which Si is doped with a specific type of dopant impurities such as boron. The dopant impurity concentration at each of the ring-shaped electrodes 12 is higher than that of the Si layer 11. The ring-shaped electrodes 12 are located in contact with the Si layer 11. The multiple ring-shaped electrodes 12 are substantially concentric, while the signal output electrode 14 is located at the substantial center of the multiple ring-shaped electrodes 12. Though three ring-shaped electrodes 12 are illustrated in the drawing, a larger number of ring-shaped electrodes 12 are formed in practice. The multiple ring-shaped electrodes (curved elements) 12 corresponds to a second semiconductor part. It is noted that the shape of each ring-shaped electrode 12 may be a deformed circular ring, and the multiple ring-shaped electrodes 12 are not necessarily concentric. Furthermore, a part of the ring-shaped electrodes 12 may be disconnected. In addition, the signal output electrode 14 may alternatively be located at a position other than the center of the multiple ring-shaped electrodes 12.

At the other surface of the Si layer 11, a rear electrode 16 serving as an electrode to which bias voltage is applied is formed on substantially the entire surface thereof. The rear electrode 16 is made of Si of a type different from that of the Si layer 11. For example, the constituent of the rear electrode 16 is p+Si. Moreover, the gettering part 13 is formed on each ring-shaped electrode 12. The gettering part 13 has a property that can getter impurities from Si. For example, the constituent of the gettering part 13 is an n-type polysilicon. The n-type polysilicon getter impurities from Si. For example, the n-type polysilicon constituting the gettering part 13 is doped with phosphorus or arsenic. The gettering part 13 being provided on the ring-shaped electrode 12 allows the gettering part 13 to be in contact with the ring-shaped electrode 12. At the portion on one surface of the Si layer 11 where the signal output electrode 14 and the ring-shaped electrode 12 are not formed, an insulation layer 15 is formed. The insulation layer 15 is made of, for example, $SiO_2$. The insulation layer 15 prevents the gettering part 13 from being in contact with the Si layer 11. Furthermore, on the gettering part 13 provided on each of the ring-shaped electrode 12 closest to the signal output electrode 14 and the ring-shaped electrode 12 farthest from the signal output electrode 14 among the multiple ring-shaped electrodes 12, a metal electrode 17 is formed. A metal electrode 18 is formed on the signal output electrode 14. The metal electrodes 17 and 18 are not illustrated in FIG. 2. It is to be noted that the metal electrode 17 may also be formed on the gettering part 13 located on the ring-shaped electrode 12 which is different from the ring-shaped electrode 12 closest to the signal output electrode 14 and the ring-shaped electrode 12 farthest from the signal output electrode 14.

A voltage application part 31 is connected to the metal electrode 17. To each of the ring-shaped electrode 12 closest to the signal output electrode 14 and the ring-shaped electrode 12 farthest from the signal output electrode 14, voltage is applied from the voltage application part 31 through the metal electrode 17 and the gettering part 13. The voltage application part 31 applies voltage so as to generate a potential difference between the ring-shaped electrode 12 closest to the signal output electrode 14 and the ring-shaped electrode 12 farthest from the signal output electrode 14. For example, voltage is so applied that the ring-shaped electrode 12 closest to the signal output electrode 14 has a high potential whereas the ring-shaped electrode 12 farthest from the signal output electrode 14 has a low potential. Moreover, the semiconductor detector 1 is so configured that a predefined electric resistance occurs between adjacent ring-shaped electrodes 12. For example, by adjusting the constituent of one part of the Si layer 11 positioned between adjacent ring-shaped electrodes 12, a channel for connecting the two ring-shaped electrodes 12 through an electric resistance is formed. That is, the multiple ring-shaped electrodes 12 are linked together through electric resistances. As voltage is applied to such ring-shaped electrodes 12 from the voltage application part 31, each of the ring-shaped electrodes 12 has a potential varying in sequence from the ring-shaped electrode 12 at the outer side to the ring-shaped electrode 12 at the inner side. For example, the ring-shaped electrodes 12 have potentials increasing in sequence from the outer side to the inner side. It is to be noted that a pair of adjacent ring-shaped electrodes 12 with the same potential may also be included in the multiple ring-shaped electrodes 12. The potentials of the ring-shaped electrodes 12 generate an electric field with gradually varying potentials from the outer side to the center in the Si layer 11. For example, an electric field with stepwise potentials that are higher toward the center and lower toward the outer side is generated. Furthermore, the voltage application part 31 applies bias voltage to the rear electrode 16 such that a potential difference occurs between the ring-shaped electrodes 12 and the rear electrode 16. For example, bias voltage is applied such that the potential is lower at the rear electrode 16 than at the ring-shaped electrodes 12, while an electric field in which the potential is increased toward the signal output electrode 14 is generated inside the Si layer 11. Accordingly, the voltage application part 31 applies voltage so as to generate such an electric field that electrons or holes generated by radiation in the Si layer 11 are concentrated at the signal output electrode 14.

The signal output electrode 14 is connected to a preamplifier 21 through the metal electrode 18. A main amplifier 32 is connected to the preamplifier 21. The semiconductor detector 1 is formed in the shape of a circular or square disc as a whole, and is used while a surface on the side where the rear electrode 16 is formed serves as an entrance surface for incident radiation. Radiation such as X-ray, electron beam or particle beam passes through the rear electrode 16 and enters inside the Si layer 11, which generates electric charges of an amount corresponding to the energy of the radiation inside the Si layer 11. The generated electric charges are electrons and holes. The generated electric charges, for example electrons, are moved by the electric field inside the Si layer 11, and are concentrated at the signal output electrode 14 while flowing therein. For example, electrons of an amount corresponding to the energy of the radiation are generated, and the generated electrons flow into the signal output electrode 14. The electric charges flowed into the signal output electrode 14 become a current signal to be input into the preamplifier 21. The preamplifier 21 converts the current signal into a voltage signal to be output to the main amplifier 32. The main amplifier 32 amplifies the voltage signal from the preamplifier 21, and outputs a signal with an intensity corresponding to the energy of the incident radiation which entered the semiconductor detector 1. The main amplifier 32 corresponds to an output part in the present disclosure.

Figure 3:
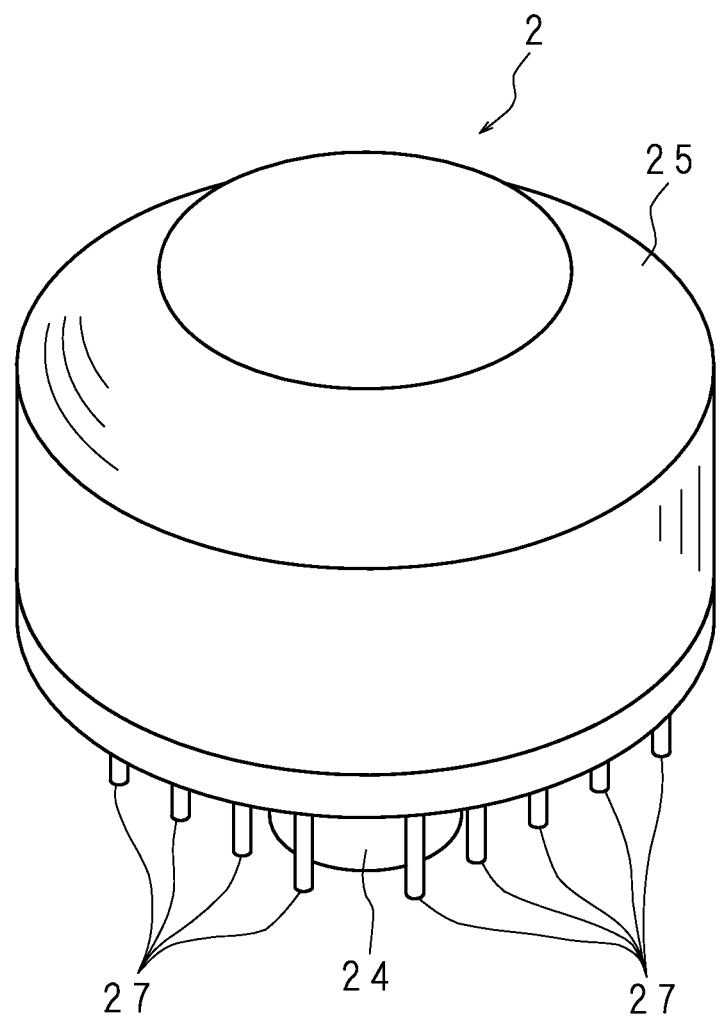
FIG. 3 is a schematic perspective view of a radiation detector including a semiconductor detector.

FIG. 3 is a schematic perspective view of a radiation detector 2 including the semiconductor detector 1. FIG. 4 is a schematic section view of the radiation detector 2 according to Embodiment 1. The radiation detector 2 includes a housing 25 having a shape of a cylinder with one end thereof being connected to a truncated cone. At an end of the housing 25, a window 26 is formed which allows passage of radiation. A semiconductor detector 1, a circuit board 22, a shielding plate 23 and a base plate 24 are arranged inside the housing 25. The base plate 24 is also referred to as a stem. The semiconductor detector 1 is mounted to the front surface of the circuit board 22 and is located at a position facing the window 26. A wiring is formed and a preamplifier 21 is mounted on the circuit board 22. Also on the circuit board 22, a wiring for applying voltage to the semiconductor detector 1 and a wiring for outputting a signal from the preamplifier 21 to the main amplifier 32 are formed. The circuit board 22 is fixed to the base plate 24 with the shielding plate 23 interposed in between.

The base plate 24 has a flat plate portion on which the circuit board 22 and the shielding plate 23 are mounted and fixed, as well as a portion penetrating the bottom part of the housing 25. By the circuit board 22 on which the semiconductor detector 1 is mounted being fixed to the base plate 24, the base plate 24 holds the semiconductor detector 1 and the circuit board 22. The shielding plate 23 is formed with a material for shielding X-ray, and is disposed between the circuit board 22 and the base plate 24. The shielding plate 23 shields secondary X-ray, generated from the base plate 24 when radiation enters the base plate 24, so as to prevent it from entering the semiconductor detector 1. Furthermore, the radiation detector 2 includes multiple lead pins 27 penetrating the bottom part of the housing 25. The lead pins 27 are connected to the circuit board 22 by a method such as wire bonding. Application of voltage to the semiconductor detector 1 by the voltage application part 31 and output of signals from the preamplifier 21 to the main amplifier 32 may be performed through the lead pins 27. Note that the base plate 24 may also be in contact with the shielding plate 23 and/or in contact with the circuit board 22.

Figure 5:
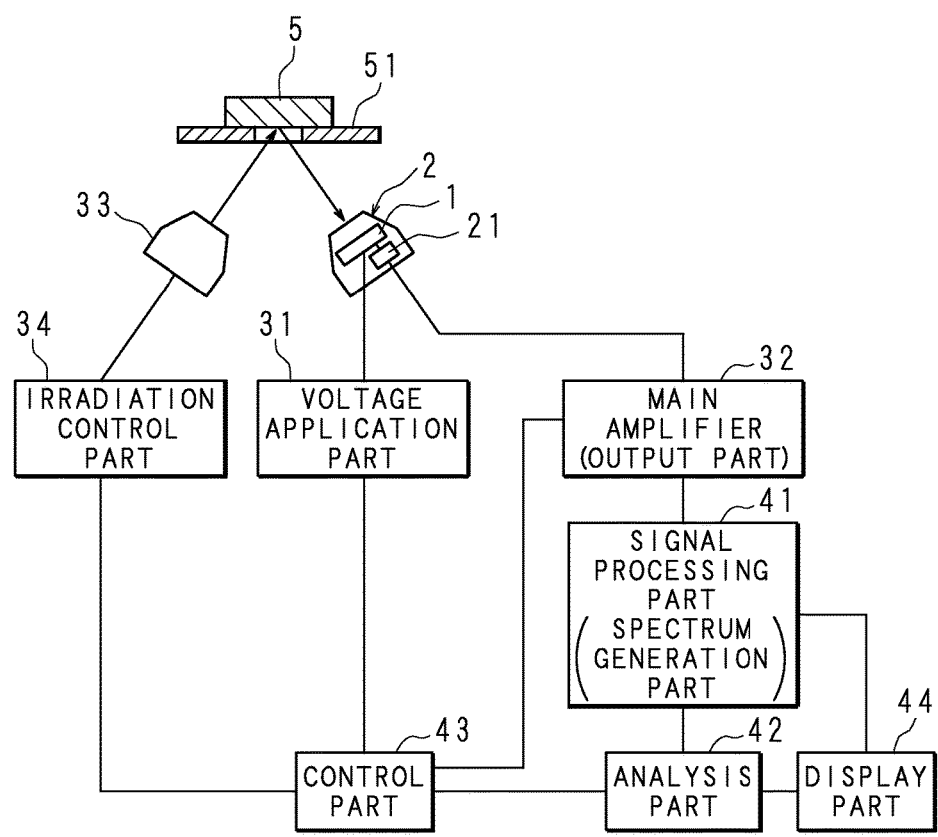
FIG. 5 is a block diagram illustrating a functional configuration of a radiation detection apparatus.

FIG. 5 is a block diagram illustrating a functional configuration of a radiation detection apparatus. The radiation detector 2 includes the semiconductor detector 1 and the preamplifier 21. The voltage application part 31 and the main amplifier 32 are located outside the radiation detector 2. The preamplifier 21 may partly be mounted to the circuit board 22, while the other portions thereof may be located outside the circuit board 22. The radiation detection apparatus includes a sample holding part 51 holding a sample 5, an irradiation part 33 irradiating the sample 5 with radiation such as X-ray, electron beam or particle beam, and an irradiation control part 34 controlling the operation of the irradiation part 33. The irradiation part 33 irradiates the sample 5 with radiation, to generate radiation such as X-ray fluorescence at the sample 5. The radiation detector 2 is located at a position where the radiation generated from the sample 5 may enter the semiconductor detector 1. In the drawing, radiation is indicated by arrows. As described earlier, the main amplifier 32 outputs a signal corresponding to the energy of radiation detected by the semiconductor detector 1. The main amplifier 32 is connected to a signal processing part 41 for processing the output signals. The signal processing part 41 performs processing of counting each value of the signals output from the main amplifier 32 and generating the relationship between the energy of radiation and the counted number, i.e. a spectrum of radiation. The signal processing part 41 corresponds to a spectrum generation part in the present disclosure.

The signal processing part 41 is connected to an analysis part 42. The analysis part 42 is configured to include an operation part performing arithmetic operation and a memory in which data is stored. The signal processing part 41 outputs data indicating the generated spectrum to the analysis part 42. The analysis part 42 receives data input from the signal processing part 41, and performs processing of identifying an element included in the sample 5 based on the spectrum indicated by the input data. The analysis part 42 may also perform processing of calculating the amount of various types of elements contained in the sample 5. The analysis part 42 is connected to a display part 44 such as a liquid-crystal display. The display part 44 displays a result of processing performed by the analysis part 42. Moreover, the display part 44 is connected to the signal processing part 41, and displays a spectrum generated by the signal processing part 41. Furthermore, the radiation detection apparatus includes a control part 43 controlling the operation of the entire apparatus. The control part 43 is connected to the voltage application part 31, the main amplifier 32, the irradiation control part 34 and the analysis part 42, to control the operation of the different parts. The control part 43 is constituted by a personal computer, for example. The control part 43 may be configured to accept the operation of the user, and to control the different parts of the radiation detection apparatus in accordance with the accepted operation. Moreover, the control part 43 and the analysis part 42 may be constituted by the same computer.

In the present embodiment, the gettering part 13 getters impurities from the Si layer 11 and the ring-shaped electrodes 12 which are made of Si. Impurities such as iron, copper, nickel, chromium or gold in the Si layer 11 pass through the ring-shaped electrodes 12 and are trapped at the gettering part 13. Accordingly, the impurities concentration inside the Si layer 11 is decreased. The causes of the leakage current occurring at the semiconductor detector 1 are impurities in the Si layer 11. As the impurities in the Si layer 11 are decreased, leakage current is reduced. Reduction of leakage current reduces the noise in a signal output from the semiconductor detector 1. In other words, according to the present embodiment, leakage current is reduced without cooling the semiconductor detector 1.

Figure 6:
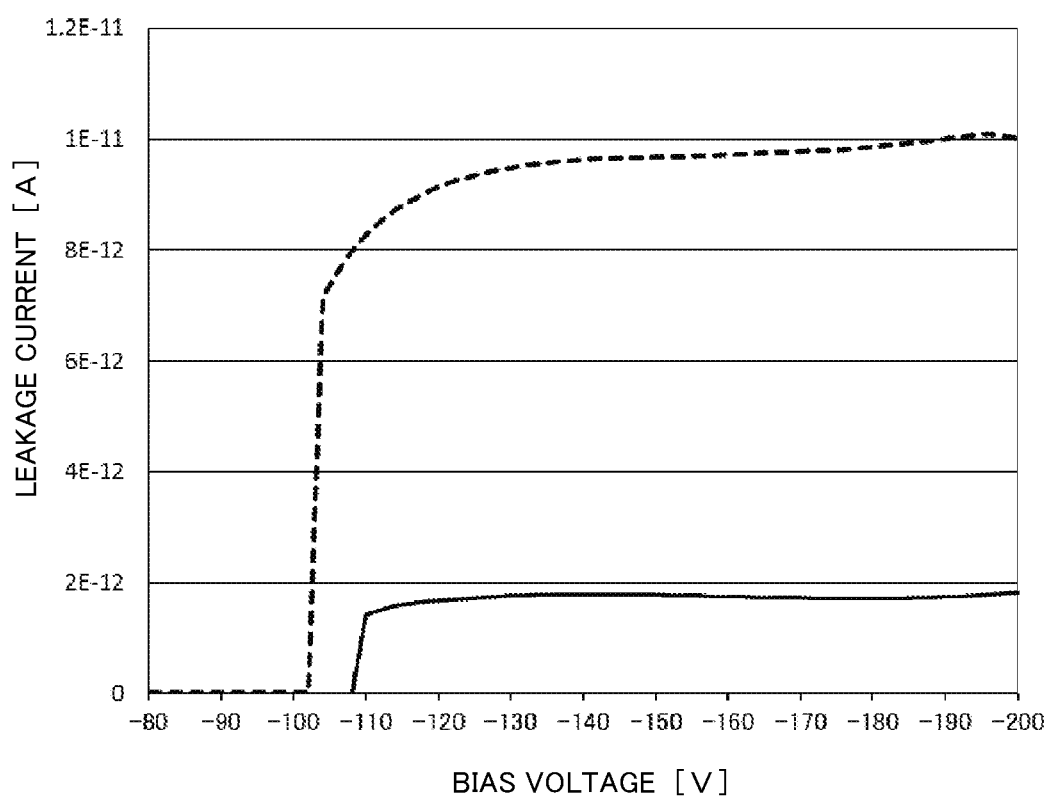
FIG. 6 is a characteristic view illustrating measurement results of leakage current.

An experiment was conducted to compare leakage current in the semiconductor detector 1 according to the present embodiment and leakage current in an SDD not provided with the gettering part 13. In the experiment, voltage was applied to the ring-shaped electrode 12 from the voltage application part 31, and leakage current output from the signal output electrode 14 was measured in a state without incident radiation. FIG. 6 is a characteristic view illustrating measurement results of leakage current. The horizontal axis represents bias voltage applied to the ring-shaped electrode 12 farthest from the signal output electrode 14, whereas the vertical axis represents leakage current output from the signal output electrode 14. Furthermore, the measurement results of leakage current obtained from the semiconductor detector 1 according to the present embodiment are indicated by a solid line, while the measurement results of leakage current obtained from the SDD not provided with the gettering part 13 are indicated by the broken line. By comparing leakage current when the bias voltage is −150V, it is found, as illustrated in FIG. 6, that the leakage current is reduced to approximately one fifth by the semiconductor detector 1 being provided with the gettering part 13.

It is conventionally known that the leakage current is reduced to approximately a half by cooling an SDD to have a lower temperature by approximately 7 degrees Celsius. The result of experiment indicating that the leakage current is reduced to approximately one fifth by the gettering part 13 means that the semiconductor detector 1 being provided with the gettering part 13 may obtain an effect similar to that in the case where the semiconductor detector 1 is cooled to have a lower temperature by approximately 16 degrees Celsius. Accordingly, the semiconductor detector 1 is able to operate at a temperature higher by approximately 16 degrees Celsius compared to the one not provided with the gettering part 13. For example, the semiconductor detector 1 may operate at a room temperature without being cooled.

According to the present embodiment, since leakage current may be reduced without cooling the semiconductor detector 1 which is an SDD, the radiation detector 2 may be configured without a cooling part as illustrated in FIG. 4. As such, in the present embodiment, the radiation detector 2 may be configured by eliminating a component which has conventionally been required, so that downsizing of the radiation detector 2 can be facilitated. With the radiation detector 2 being downsized, the degree of freedom in design of a radiation detection apparatus may be improved. Such improvement in the degree of freedom in design makes it possible to appropriately design a radiation detection apparatus by, for example, arranging the radiation detector 2 at an appropriate position. For example, the arrangement of the radiation detector 2 at a position where the radiation from the sample 5 enters the semiconductor detector 1 at an optimal solid angle may improve the accuracy of detecting radiation. It is therefore possible to detect radiation at high accuracy by the use of the radiation detection apparatus according to the present embodiment.

The gettering part 13 is formed on the ring-shaped electrode 12 disposed at a surface opposite to the radiation entering side of the Si layer 11, and is not formed on the other portions. Since the gettering part 13 is not formed inside the Si layer 11 or on the surface at the radiation entering side, it will not affect radiation entering the Si layer 11 as well as generation of electric charges inside the Si layer 11. The gettering part 13 will therefore not lower the efficiency of detecting radiation. Moreover, because the gettering part 13 is not directly in contact with the Si layer 11, dopant impurities such as boron, phosphorus or arsenic will not intrude into the Si layer 11 from the gettering part 13, thereby preventing the constituent as well as the characteristic of the Si layer 11 from changing. While the gettering part 13 is in contact with the ring-shaped electrode 12, the dopant impurities from the gettering part 13 have no effect, since the ring-shaped electrode 12, that has higher dopant impurities concentration than that of the Si layer 11, is deep enough to compensate the effects of the dopant impurities from the gettering part 13. Thus, the gettering part 13 does not have an adverse effect on the performance of the semiconductor detector 1. Since the gettering part 13 has no adverse effect on the operation of the semiconductor detector 1, it is possible to use the semiconductor detector 1 while still including the gettering part 13. That is, it is unnecessary to remove the gettering part 13 during the manufacturing process of the semiconductor detector 1 and the gettering part 13 may remain until the end of the manufacturing procedure. Accordingly, the impurities that are unintentionally mixed in during the manufacturing procedure of the semiconductor detector 1 may reliably be trapped until the end of the manufacturing procedure.

Furthermore, as being formed on the multiple ring-shaped electrodes 12 located at one surface of the Si layer 11, the gettering part 13 is formed in a wide range of the one surface of the semiconductor detector 1. Since the gettering part 13 is formed in a rather wide area, not only at a part, of the semiconductor detector 1, the distance from the impurities in the Si layer 11 to the gettering part 13 is short, which facilitates the impurities to easily be trapped in the gettering part 13. Hence, leakage current is effectively reduced while the accuracy of detecting radiation is improved.

Embodiment 2

Figure 7:
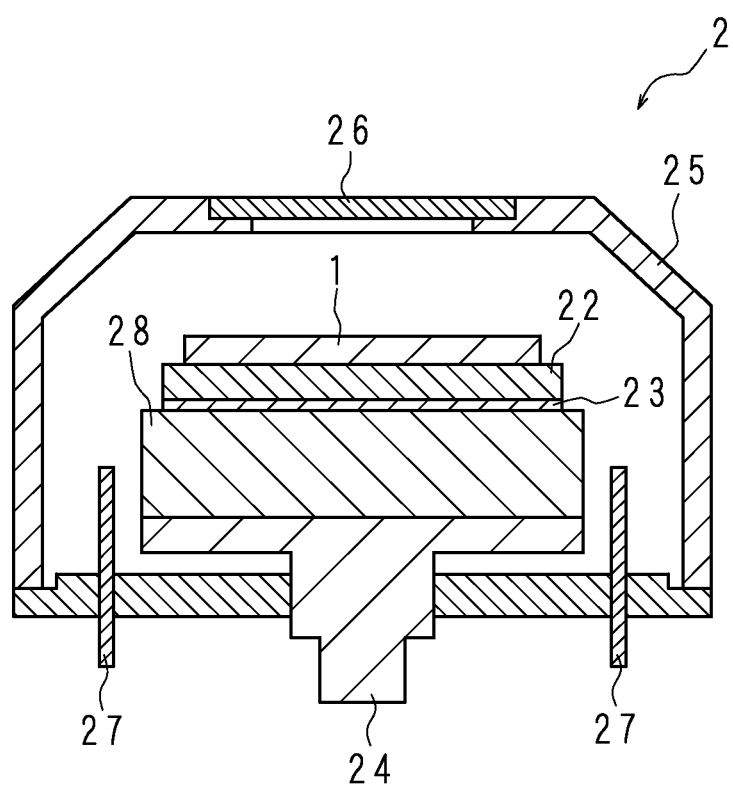
FIG. 7 is a schematic section view of a radiation detector according to Embodiment 2.

FIG. 7 is a schematic section view of a radiation detector 2 according to Embodiment 2. The radiation detector 2 includes a cooling part 28 for cooling the semiconductor detector 1. For example, the cooling part 28 is a Peltier device. A heat dissipating portion of the cooling part 28 is thermally in contact with the flat-plate portion of the base plate 24. The shielding plate 23 is disposed between the cooling part 28 and the circuit board 22, and is thermally in contact with the heat absorbing portion of the cooling part 28. The shielding plate 23 shields X-ray generated from the cooling part 28 or base plate 24 when radiation enters the cooling part 28 or base plate 24, so as to prevent the X-ray from entering the semiconductor detector 1. The heat from the semiconductor detector 1 is absorbed into the cooling part 28 through the circuit board 22 and the shielding plate 23, is transmitted from the cooling part 28 to the base plate 24, and is dissipated to the outside of the radiation detector 2 through the base plate 24. The radiation detector 2 as well as the other components are configured similarly to those in Embodiment 1. Moreover, the radiation detection apparatus is configured similarly to that in Embodiment 1.

In the present embodiment, in addition to the cooling part 28 cooling the semiconductor detector 1, the gettering part 13 functions to reduce leakage current in the semiconductor detector 1. Since the semiconductor detector 1 can operate even if the cooling performance of the cooling part 28 is lowered, it is possible to downsize the cooling part 28 and to facilitate downsizing of the radiation detector 2. Furthermore, even the semiconductor detector 1 having a size in which leakage current cannot sufficiently be reduced from cooling by cooling part 28 alone may also operate by being provided with the gettering part 13. It is thus possible to use the semiconductor detector 1 with an increased area of incidence and to improve the efficiency of detecting radiation. Moreover, cooling of the semiconductor detector 1 provided with the gettering part 13 by the cooling part 28 more significantly reduces leakage current compared to the conventional case, which more significantly reduces noise in a signal output from the semiconductor detector 1. This can therefore improve the accuracy of detecting radiation.

While Embodiments 1 and 2 described above have illustrated forms in which the semiconductor detector 1 includes multiple ring-shaped electrodes 12, the semiconductor detector 1 may alternatively include, instead of the multiple ring-shaped electrodes 12, multiple curved electrodes each having a shape other than a ring shape. The curved electrodes have different distances to the signal output electrode 14 from each other. The multiple curved electrodes are applied with voltage from the voltage application part 31, presents different potentials in sequence, and generates an electric field in which the potential gradually varies toward the signal output electrode 14 within the Si layer 11. For example, the shape of each curved electrode may be an arc shape.

Furthermore, while Embodiments 1 and 2 described above have illustrated examples where the semiconductor detector 1 is an SDD, the semiconductor detector 1 may also be a detector other than an SDD, such as a detector using a PIN diode. Moreover, the semiconductor detector 1 is not limited to the form in which the gettering part 13 is in contact with the ring-shaped electrode 12 made of p+Si. The gettering part 13 may also be in contact with the second semiconductor part if the second semiconductor part has dopant impurity concentration higher than that of the first semiconductor part in which an electric field is generated therein for detecting radiation. For example, the gettering part 13 may be formed to be in contact with a semiconductor part made of n+Si. Furthermore, while Embodiments 1 and 2 have described examples where the gettering part 13 is made of polysilicon, the constituent of the gettering part 13 may be any substance other than polysilicon that has a property of gettering impurities within Si.

While Embodiments 1 and 2 have mainly described examples where the first semiconductor part (Si layer 11) is made of an n-type semiconductor whereas the second semiconductor part (ring-shaped electrode 12) is made of a p-type semiconductor, the semiconductor detector 1 may have a form in which the first semiconductor part is made of a p-type semiconductor whereas the second semiconductor part is made of an n-type semiconductor. Moreover, while Embodiments 1 and 2 have mainly described a form in which electrons generated by radiation is concentrated at and flow into the signal output electrode 14, the semiconductor detector 1 may alternatively have a form in which holes generated by radiation are concentrated at and flow into the signal output electrode 14. Furthermore, the radiation detection apparatus may also take a form of detecting radiation entering from the outside without being provided with the irradiation part 33.

It is to be noted that, as used herein and in the appended claims, the singular forms "a", "an", and "the" include plural referents unless the context clearly dictates otherwise.

It is to be noted that the disclosed embodiment is illustrative and not restrictive in all aspects. The scope of the present invention is defined by the appended claims rather than by the description preceding them, and all changes that fall within metes and bounds of the claims, or equivalence of such metes and bounds thereof are therefore intended to be embraced by the claims.

What is claimed is:

1. A semiconductor detector for detecting radiation, comprising:
    a first semiconductor part in which an electron and a hole are generated by incident radiation;
    a signal output electrode outputting a signal based on the electron or the hole;
    a gettering part gettering impurities in the first semiconductor part; and
    a second semiconductor part doped with a type of dopant impurities and having dopant impurity concentration higher than dopant impurity concentration of the first semiconductor part, wherein the second semiconductor part is in contact with the first semiconductor part, the gettering part is in contact with the second semiconductor part and not in contact with the first semiconductor part, one of the first semiconductor part and the second semiconductor part includes a constituent composed of n-type silicon and the other of the first semiconductor part and the second semiconductor part includes a constituent composed of p-type silicon, and the gettering part includes n-type polysilicon.

2. The semiconductor detector according to claim 1, wherein the first semiconductor part has a plate-like shape, the second semiconductor part is located at one surface of the first semiconductor part, the other surface of the first semiconductor part is an entrance surface for incident radiation, and the gettering part is located on the second semiconductor part.

3. The semiconductor detector according to claim 2, wherein the second semiconductor part is formed with multiple curved elements.

4. A radiation detector, comprising:

the semiconductor detector according to claim 1;

a circuit board on which the semiconductor detector is mounted; and a base plate holding the semiconductor detector and the circuit board.

5. A radiation detection apparatus, comprising:

the semiconductor detector according to claim 1 detecting radiation;

an output part outputting a signal corresponding to energy of radiation detected by the semiconductor detector; and a spectrum generation part generating a spectrum of the radiation based on the signal output by the output part.

6. A radiation detection apparatus detecting radiation generated from a sample irradiated with radiation, comprising:

an irradiation part irradiating a sample with radiation;

the semiconductor detector according to claim 1 detecting radiation generated from the sample;

an output part outputting a signal corresponding to energy of radiation detected by the semiconductor detector;

a spectrum generation part generating a spectrum of the radiation based on the signal output by the output part; and a display part displaying the spectrum generated by the spectrum generation part.

* * * * *